(12) United States Patent

Norley et al.

(10) Patent No.: US 7,494,712 B2
(45) Date of Patent: Feb. 24, 2009

(54) RESIN-IMPREGNATED FLEXIBLE GRAPHITE ARTICLES

(75) Inventors: Julian Norley, Chagrin Falls, OH (US); John Joseph Brady, Cleveland, OH (US); George Getz, Jr., Parma Heights, OH (US); Jeremy Klug, Brunswick, OH (US)

(73) Assignee: GrafTech International Holdings Inc., Parma, OH (US)

( * ) Notice: Subject to any disclaimer, the term of this patent is extended or adjusted under 35 U.S.C. 154(b) by 0 days.

(21) Appl. No.: 11/087,092

(22) Filed: Mar. 22, 2005

(65) Prior Publication Data

US 2005/0227084 A1    Oct. 13, 2005

Related U.S. Application Data

(60) Division of application No. 10/831,385, filed on Apr. 23, 2004, now abandoned, which is a continuation-in-part of application No. 09/943,131, filed on Aug. 31, 2001, now Pat. No. 6,777,086.

(51) Int. Cl.
    *B32B 9/00* (2006.01)
(52) U.S. Cl. ........................ 428/408; 165/185
(58) Field of Classification Search ............ 428/408; 165/185; 423/448, 445
    See application file for complete search history.

(56) References Cited

U.S. PATENT DOCUMENTS

| 3,404,061 A | * | 10/1968 | Bochman et al. | ............ 428/143 |
| 4,895,713 A | | 1/1990 | Greinke et al. | ............ 423/448 |
| 5,224,030 A | | 6/1993 | Banks et al. | ................ 361/386 |
| 5,228,701 A | * | 7/1993 | Greinke et al. | ............ 277/539 |
| 5,316,080 A | | 5/1994 | Banks et al. | ................ 165/185 |
| 5,902,762 A | | 5/1999 | Mercuri et al. | ................ 501/99 |

FOREIGN PATENT DOCUMENTS

| EP | 0805463 A | 11/1997 |
| WO | 02/081187 A | 10/2002 |
| WO | 02/081190 A | 10/2002 |

OTHER PUBLICATIONS

International Publication No. WO 00/64808, by UCAR Graph-Tech Inc., Nov. 2, 2000.

* cited by examiner

*Primary Examiner*—Keith D Hendricks
*Assistant Examiner*—Daniel Miller
(74) *Attorney, Agent, or Firm*—James R. Cartiglia; Waddey & Patterson, PC

(57) ABSTRACT

Composites are prepared from resin-impregnated flexible graphite materials. Impregnated materials are compressed and cured at elevated temperature and pressure to form structures suitable for uses such as electronic thermal management (ETM) devices, supercapacitors and secondary batteries.

10 Claims, No Drawings

RESIN-IMPREGNATED FLEXIBLE GRAPHITE ARTICLES

This is a divisional application of application Serial No. 10/831,385 entitled Resin-Impregnated Flexible Graphite Articles, filed April 23, 2004 now abandoned.

RELATED APPLICATION

This application is a continuation-in-part of application having Ser. No. 09/943,131 filed Aug. 31, 2001, entitled "Laminates Prepared From Impregnated Flexible Graphite Sheets", which has now issued as U.S. Pat. No. 6,777,086, the disclosure of which is incorporated herein by reference.

TECHNICAL FIELD

This invention relates to articles formed from resin-impregnated, compressed particles of exfoliated graphite (commonly referred to as flexible graphite), which are cured under heat and pressure and are useful in applications such as heat transporters used in electronic thermal management (ETM), or current collectors for supercapacitors and secondary batteries.

BACKGROUND ART

Compressed exfoliated graphite articles are known in the art, as are composite materials comprising resin-impregnated graphite sheets. These structures find utility, for example, in gasket manufacture.

In addition to their utility in gasket materials, graphite composites also find utility as heat transfer or cooling apparatus. The use of various solid structures as heat transporters is known in the art. For example, Banks, U.S. Pat. Nos. 5,316,080 and 5,224,030 discloses the utility of diamonds and gas-derived graphite fibers, joined with a suitable binder, as heat transfer devices. Such devices are employed to passively conduct heat from a source, such as a semiconductor, to a heat sink.

Graphite-based thermal management components offer several advantages in electronic applications and can help eliminate the potential negative impacts of heat generating components in computers, communications equipment, and other electronic devices. Graphite-based thermal management components include heat sinks, heat pipes and heat spreaders. All offer thermal conductivity comparable with or better than copper or aluminum, but are a fraction of the weight of those materials, and provide significantly greater design flexibility. Graphite-based thermal management products take advantage of the highly directional properties of graphite to move heat away from sensitive components. Compared to typical aluminum alloys used for heat management, the inventive graphite components can exhibit up to 300% higher thermal conductivity, with values comparable to copper (~400 watts per meter degree Kelvin, i.e., W/mK) or greater. Further, aluminum and copper are isotropic, making it difficult to channel the heat in a preferred direction.

The graphite material for use in this invention is graphite material formed from compressed particles of exfoliated graphite.

The following is a brief description of graphite and the manner in which it is typically processed to form flexible materials. Graphite, on a microscopic scale, is made up of layer planes of hexagonal arrays or networks of carbon atoms. These layer planes of hexagonally arranged carbon atoms are substantially flat and are oriented or ordered so as to be substantially parallel and equidistant to one another. The substantially-flat, parallel, equidistant sheets or layers of carbon atoms, usually referred to as graphene layers or basal planes, are linked or bonded together and groups thereof are arranged in crystallites. Highly-ordered graphite materials consist of crystallites of considerable size, the crystallites being highly aligned or oriented with respect to each other and having well ordered carbon layers. In other words, highly ordered graphites have a high degree of preferred crystallite orientation. It should be noted that graphites, by definition, possess anisotropic structures and thus exhibit or possess many characteristics that are highly directional, e.g., thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite articles possess a very high degree of orientation.

As noted above, the bonding forces holding the parallel layers of carbon atoms together are only weak van der Waals forces. Natural graphites can be chemically treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been chemically or thermally expanded and more particularly expanded so as to have a final thickness or "c" direction dimension which is as much as about 80 or more times the original "c" direction dimension, can be formed without the use of a binder into cohesive or integrated sheets of expanded graphite, e.g. webs, papers, strips, tapes, or the like (typically referred to as "flexible graphite"). The formation of graphite particles which have been expanded to have a final thickness or "c" dimension which is as much as about 80 times or more the original "c" direction dimension into integrated flexible articles by compression, without the use of any binding material, is believed to be possible due to the mechanical interlocking, or cohesion, which is achieved between the voluminously expanded graphite particles.

In addition to flexibility, the graphite material, as noted above, has also been found to possess a high degree of anisotropy to thermal and electrical conductivity and fluid diffusion, somewhat less, but comparable to the natural graphite starting material due to orientation of the expanded graphite particles substantially parallel to the opposed faces of the material resulting from very high compression, e.g. roll processing. Material thus produced has excellent flexibility, good strength and a very high degree or orientation. There is a need for processing that more fully takes advantage of these properties.

Briefly, the process of producing binderless anisotropic graphite material, e.g. sheets, articles, web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, integrated graphite article. Typically, the article formed is a flexible, relatively thin (i.e., 5 mm or less) sheet, although thicker articles are also capable of being produced in this manner. The expanded graphite particles that generally are worm-like or vermiform in appearance will, once compressed, maintain the compression set and alignment with the opposed major surfaces of the sheet. Properties of the article may be altered by coatings and/or the addition of binders or additives prior to the compression step. See U.S. Pat. No. 3,404,061 to Shane, et al. The density and thickness of the material can be varied by controlling the degree of compression.

Lower densities are advantageous where surface detail requires embossing or molding, and lower densities aid in achieving good detail. However, higher in-plane strength, thermal conductivity and electrical conductivity are generally favored by more dense sheets. Typically, the density of the material will be within the range of from about 0.04 g/cm$^3$ to about 1.4 g/cm$^3$.

Graphite material made as described above typically exhibits an appreciable degree of anisotropy due to the alignment of graphite particles parallel to the major opposed, parallel surfaces of the material, with the degree of anisotropy increasing upon roll pressing to increased density. In roll-pressed anisotropic material, the thickness, i.e. the direction perpendicular to the opposed, parallel surfaces comprises the "c" direction and the directions ranging along the length and width, i.e. along or parallel to the opposed, major surfaces comprises the "a" directions and the thermal, electrical and fluid diffusion properties of the material are very different, by orders of magnitude typically, for the "c" and "a" directions.

DISCLOSURE OF THE INVENTION

It is an object of the invention to provide a resin impregnated graphite article suitable for use in electronic thermal management (ETM), supercapacitors or secondary batteries.

It is a further object of this invention to provide graphite structures having enhanced in-plane properties.

It is a further object of the invention to provide a machinable graphite structure having relatively high thermal conductivity in the "a" directions and relatively low conductivity in the "c" direction.

These and other objects are accomplished by the present invention, which provides structure comprising resin impregnated graphite articles formed of compressed particles of exfoliated graphite.

BEST MODE FOR CARRYING OUT THE INVENTION

This invention is based upon the finding that when articles of epoxy impregnated graphite are compressed (such as by calendering) and then cured at elevated temperatures and pressures, the resultant material exhibits unexpectedly good mechanical and thermal properties and also possesses good machinability.

Before describing the manner in which the invention improves current materials, a brief description of graphite and its formation into integrated articles, which will become the primary substrate for forming the products of the invention, is in order.

Preparation of Graphite Articles

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms, and are sometimes referred to herein as "particles of expanded graphite." The worms may be compressed together into articles that, unlike the original graphite flakes, can be formed and cut into various shapes and provided with small transverse openings by deforming mechanical impact.

Graphite starting materials for the inventive materials include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

The graphite starting materials for the materials used in the present invention may contain non-carbon components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheets is described by Shane et al. in U.S. Pat. No. 3,404,061, the disclosure of which is incorporated herein by reference. In one embodiment of the practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2-12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 2 hours, with shorter heating periods, e.g., at least about 10 minutes, for higher temperatures in the above-noted range. Times of one-half hour or less, e.g., on the order of 10 to 25 minutes, can be employed at the higher temperatures.

The above described methods for intercalating and exfoliating graphite flake may beneficially be augmented by a pretreatment of the graphite flake at graphitization temperatures, i.e. temperatures in the range of about 3000° C. and above and by the inclusion in the intercalant of a lubricious additive.

The pretreatment, or annealing, of the graphite flake results in significantly increased expansion (i.e., increase in expansion volume of up to 300% or greater) when the flake is subsequently subjected to intercalation and exfoliation. Indeed, desirably, the increase in expansion is at least about 50%, as compared to similar processing without the annealing step. The temperatures employed for the annealing step should not be significantly below 3000° C., because temperatures even 100° C. lower result in substantially reduced expansion.

The annealing of the present invention is performed for a period of time sufficient to result in a flake having an enhanced degree of expansion upon intercalation and subsequent exfoliation. Typically the time required will be 1 hour or more, preferably 1 to 3 hours and will most advantageously proceed in an inert environment. For maximum beneficial results, the annealed graphite flake will also be subjected to other processes known in the art to enhance the degree expansion—namely intercalation in the presence of an organic reducing agent, an intercalation aid such as an organic acid, and a surfactant wash following intercalation. Moreover, for maximum beneficial results, the intercalation step may be repeated.

The annealing step of the instant invention may be performed in an induction furnace or other such apparatus as is known and appreciated in the art of graphitization; for the temperatures here employed, which are in the range of 3000° C., are at the high end of the range encountered in graphitization processes.

Because it has been observed that the worms produced using graphite subjected to pre-intercalation annealing can sometimes "clump" together, which can negatively impact area weight uniformity, an additive that assists in the formation of "free flowing" worms is highly desirable. The addition of a lubricious additive to the intercalation solution facilitates the more uniform distribution of the worms across the bed of a compression apparatus (such as the bed of a calender station conventionally used for compressing, or "calendering," graphite worms into an integrated graphite article). The resulting article therefore has higher area weight uniformity and greater tensile strength. The lubricious additive is preferably a long chain hydrocarbon, more preferably a hydrocarbon having at least about 10 carbons. Other organic compounds having long chain hydrocarbon groups, even if other functional groups are present, can also be employed.

More preferably, the lubricious additive is an oil, with a mineral oil being most preferred, especially considering the fact that mineral oils are less prone to rancidity and odors, which can be an important consideration for long term storage. It will be noted that certain of the expansion aids detailed above also meet the definition of a lubricious additive. When these materials are used as the expansion aid, it may not be necessary to include a separate lubricious additive in the intercalant.

The lubricious additive is present in the intercalant in an amount of at least about 1.4 pph, more preferably at least about 1.8 pph. Although the upper limit of the inclusion of lubricous additive is not as critical as the lower limit, there does not appear to be any significant additional advantage to including the lubricious additive at a level of greater than about 4 pph.

The thus treated particles of graphite are sometimes referred to as "particles of intercalated graphite." Upon exposure to high temperature, e.g. temperatures of at least about 160° C. and especially about 700° C. to 1200° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into articles that, unlike the original graphite flakes, can be formed and cut into various shapes and provided with small transverse openings by deforming mechanical impact as hereinafter described.

The graphite materials prepared as described are coherent, with good handling strength, and are suitably compressed, e.g. by molding or roll-pressing, to a thickness of about 0.075 mm to 30 mm and a typical density of about 0.1 to 1.5 grams per cubic centimeter (g/cc). From about 1.5-30% by weight of ceramic additives can be blended with the intercalated graphite flakes as described in U.S. Pat. No. 5,902,762 (which is incorporated herein by reference) to provide enhanced resin impregnation in the final graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

As noted above, the graphite materials are also treated with resin and the absorbed resin, after curing, enhances the moisture resistance and handling strength, i.e. stiffness, of the material as well as "fixing" the morphology of the sheet. The amount of resin within the epoxy impregnated graphite articles should be an amount sufficient to ensure that the final cured structure is dense and cohesive, yet the anisotropic thermal conductivity associated with a densified graphite structure is preserved or improved. Suitable resin content is preferably at least about 3% by weight, more preferably about 5 to 35% by weight, and suitably up to about 60% by weight. Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

In a typical resin impregnation step, the flexible graphite material is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite. The resin is thereafter preferably dried, reducing the tack of the resin and the resin-impregnated article.

Alternatively, the flexible graphite of the present invention may utilize particles of reground flexible graphite materials rather than freshly expanded worms. The reground materials may be newly formed material, recycled material, scrap material, or any other suitable source.

Also the processes of the present invention may use a blend of virgin materials and recycled materials.

The source material for recycled materials may be articles or trimmed portions of articles that have been compression molded as described above, or sheets that have been compressed with, for example, pre-calendering rolls, but have not yet been impregnated with resin. Furthermore, the source material may be impregnated with resin, but not yet cured, or impregnated with resin and cured. The source material may also be recycled flexible graphite fuel cell components such as flow field plates or electrodes. Each of the various sources of graphite may be used as is or blended with natural graphite flakes.

Once the source material of flexible graphite is available, it can then be comminuted by known processes or devices, such as a jet mill, air mill, blender, etc. to produce particles. Preferably, a majority of the particles have a diameter such that they will pass through 20 U.S. mesh; more preferably a major portion (greater than about 20%, most preferably greater than about 50%) will not pass through 80 U.S. mesh. Most preferably the particles have a particle size of no greater than about 20 mesh. It may be desirable to cool the flexible graphite when it is resin-impregnated as it is being comminuted to avoid heat damage to the resin system during the comminution process.

The size of the comminuted particles may be chosen so as to balance machinability and formability of the graphite article with the thermal characteristics desired. Thus, smaller particles will result in a graphite article which is easier to machine and/or form, whereas larger particles will result in a graphite article having higher anisotropy, and, therefore, greater in-plane electrical and thermal conductivity.

Once the source material is comminuted (if the source material has been resin impregnated, then preferably the resin is removed from the particles), it is then re-expanded. The re-expansion may occur by using the intercalation and exfoliation process described above and those described in U.S. Pat. No. 3,404,061 to Shane et al. and U.S. Pat. No. 4,895,713 to Greinke et al.

Typically, after intercalation the particles are exfoliated by heating the intercalated particles in a furnace. During this exfoliation step, intercalated natural graphite flakes may be added to the recycled intercalated particles. Preferably, during the re-expansion step the particles are expanded to have a specific volume in the range of at least about 100 cc/g and up to about 350 cc/g or greater. Finally, after the re-expansion step, the re-expanded particles may be compressed into coherent materials and impregnated with resin, as described.

Graphite materials prepared according to the foregoing description can also be generally referred to as compressed particles of exfoliated graphite. Since the materials are resin-impregnated, the resin in the sheets needs to be cured before the sheets are used in their intended applications, such as for electronic thermal management.

According to the invention, resin-impregnated graphite materials prepared as described above are compressed to the desired thickness and shape, commonly a thickness of about 0.35 mm to 0.5 mm, at which time the impregnated mats have a density of about 1.4 g/cm³ to about 1.9 g/cm³.

Following the compression step (such as by calendering), the impregnated materials are cut to suitable-sized pieces and placed in a press, where the resin is cured at an elevated temperature. The temperature should be sufficient to ensure that the lamellar structure is densified at the curing pressure, while the thermal properties of the structure are not adversely impacted. Generally, this will require a temperature of at least about 90° C., and generally up to about 200° C. Most preferably, cure is at a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to density the structure to the required degree will be utilized. Such a pressure will generally be at least about 7 megapascals (Mpa, equivalent to about 1000 pounds per square inch), and need not be more than about 35 Mpa (equivalent to about 5000 psi), and more commonly from about 7 to about 21 Mpa (1000 to 3000 psi). The curing time may vary depending on the resin system and the temperature and pressure employed, but generally will range from about 0.5 hours to 2 hours. After curing is complete, the composites are seen to have a density of at least about 1.8 g/cm³ and commonly from about 1.8 g/cm³ to 2.0 g/cm³.

Although the formation of sheets through calendering or molding is the most common method of formation of the graphite materials useful in the practice of the present invention, other forming methods can also be employed. For instance, the exfoliated graphite particles can be compression molded into a net shape or near net shape. Thus, if the end application requires an article, such as a heat sink or heat spreader, assuming a certain shape or profile, that shape or profile can be molded into the graphite article, before or after resin impregnation. Cure would then take place in a mold assuming the same shape; indeed, in the preferred embodiment, compression and curing will take place in the same mold. Machining to the final shape can then be effected.

The temperature- and pressure-cured graphite/resin composites of the present invention provide for the first time a graphite-based composite material having in-plane thermal conductivity rivaling or exceeding that of copper, at a fraction of the weight of copper. More specifically, the inventive composites exhibit in-plane thermal conductivities of at least about 300 W/mK, with through-plane thermal conductivities of less than about 15 W/mK, more preferably less than about 10 W/mK. Such materials will be extremely useful in heat dissipation applications, such as in heat sinks, heat spreaders, heat pipes and the like, especially where the weight of copper would be disadvantageous.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. An electronic thermal management article comprising at least one sheet of resin impregnated, compressed particles of exfoliated graphite cured by the simultaneous application of pressure of at least 7 MPa and a temperature sufficient to cure the resin, wherein the article exhibits a thermal conductivity which is anisotropic in nature and is greater than about 300 W/mK in at least one plane.

2. The article of claim 1 wherein the graphite sheet is simultaneously cured at a temperature of at least about 90° C. and at a pressure of at least about 7 MPa.

3. The article of claim 1 wherein the anisotropic thermal conductivity varies by a factor of at least 15 as between a plane with a higher thermal conductivity and a plane with lower thermal conductivity.

4. The device of claim 1 wherein the pressure cured graphite sheet has a density greater than about 1.85 g/cm3.

5. The article of claim 1 wherein the sheet of graphite has a resin content of at least about 3% by weight.

6. The article of claim 5 wherein the sheet of graphite has a resin content of from about 5% to about 35% by weight.

7. An anisotropic electronic thermal management article having a thermal conductivity of greater than about 300 W/mK in an in plane direction and a thermal conductivity of less than about 15 W/mK in an out of plane direction and comprising at least one resin impregnated sheet of compressed particles of exfoliated graphite cured by the simultaneous appllication of pressure of at least 7 MPa and a temperature sufficient to cure the resin.

8. The article of claim 7 wherein the resin is epoxy.

9. The device of claim 7 wherein the resin impregnated sheet has a density of at least about 1.85 g/cm3.

10. The article of claim 7 wherein the graphite sheet is simultaneously cured at a temperature of at least about 90° C. and at a pressure of at least about 7 MPa.

* * * * *